(12) United States Patent
Kubota et al.

(10) Patent No.: US 6,599,435 B2
(45) Date of Patent: Jul. 29, 2003

(54) METHOD FOR CONTROLLING FLATNESS OF WAFER AND MANUFACTURING METHOD OF THIN-FILM MAGNETIC HEAD

(75) Inventors: Toshio Kubota, Tokyo (JP); Fujimi Kimura, Tokyo (JP)

(73) Assignee: TDK Corporation, Tokyo (JP)

( * ) Notice: Subject to any disclaimer, the term of this patent is extended or adjusted under 35 U.S.C. 154(b) by 236 days.

(21) Appl. No.: 09/867,425

(22) Filed: May 31, 2001

(65) Prior Publication Data

US 2002/0045352 A1 Apr. 18, 2002

(30) Foreign Application Priority Data

Jun. 5, 2000 (JP) ........................................ 2000-167411

(51) Int. Cl.⁷ ................................................ B44C 1/22
(52) U.S. Cl. .............................. 216/22; 216/38; 216/52; 216/57

(58) Field of Search ............................... 216/22, 38, 52, 216/57, 89; 134/31, 37; 438/691, 692, 693, 706, 748

(56) References Cited

U.S. PATENT DOCUMENTS

| | | | | |
|---|---|---|---|---|
| 4,470,856 A | * | 9/1984 | Little et al. .............. | 438/692 X |
| 5,382,551 A | * | 1/1995 | Thakur et al. .......... | 438/692 X |
| 5,821,166 A | * | 10/1998 | Hajime et al. .......... | 438/692 X |
| 5,853,962 A | | 12/1998 | Bowers | |

* cited by examiner

Primary Examiner—William A. Powell
(74) Attorney, Agent, or Firm—Burns, Doane, Swecker & Mathis, LLP

(57) ABSTRACT

A gas at an extremely low temperature is jet-sprayed onto a warped concave surface of a wafer to correct this warped concave surface flat.

10 Claims, 1 Drawing Sheet

US 6,599,435 B2

METHOD FOR CONTROLLING FLATNESS OF WAFER AND MANUFACTURING METHOD OF THIN-FILM MAGNETIC HEAD

FIELD OF THE INVENTION

The present invention relates to a method for controlling flatness of a wafer and to a method of manufacturing a plurality of thin-film magnetic heads from a wafer by using the flatness control method.

DESCRIPTION OF THE RELATED ART

When fabricating thin-film magnetic heads, performed are various wafer processes for forming many of arranged thin-film magnetic transducer elements on a wafer. Particularly, when fabricating composite or integrated thin-film magnetic heads each having a magnetoresistive effect (MR) transducer element currently in vogue and an inductive transducer element, since the structure is complicated for the improvement in characteristic, the wafer processes have become very complicated and new processes which were not experienced conventionally are necessary to perform. As a result, various and complicated stresses have affected the whole of the wafer.

According to the conventional technique, since it is difficult to compensate the influence of such complicated stresses, each wafer process may be performed under different flatness from each other.

However, if the improvement in a performance such as a record density is required much more from now on, these deteriorations in wafer flatness may cause variations in the depth of focus (DOF) in photo-processes or nonuniform polishing in chemical and mechanical polishing (CMP) processes. As a result, generation of inferior goods will increase and the yield will get worse.

SUMMARY OF THE INVENTION

It is therefore an object of the present invention to provide a method for controlling flatness of a wafer and to a manufacturing method of a thin-film magnetic head, whereby camber or warp of the wafer can be easily corrected during a wafer process.

According to the present invention, a method for controlling a flatness of a wafer with a warped concave surface, and a manufacturing method of a thin-film magnetic head includes a step of jet-spraying a gas at an extremely low temperature onto the warped concave surface of the wafer to correct the warped concave surface flat.

A gas at an extremely low temperature is jet-sprayed onto a warped concave surface of a wafer warped for any reason causing its flatness to deteriorate. Thus, the stresses on the front and back surfaces of the wafer are brought into balance so that the warp is corrected to improve the flatness of the wafer surface. Since a warp or distortion of the wafer can be easily corrected by jet-spraying an extremely low temperature gas, a flatness of the wafer can be easily controlled within a desired range in a short time during the wafer process. In complicated wafer processes, if this warp correction is repeatedly performed, it is possible to precisely complete each process. As a result, high performance thin-film magnetic heads can be fabricated with an excellent yield. Also, since the warp of the wafer can be corrected by jet-spraying a gas without contacting to the wafer surface, the flatness control can of a wafer surface be carried out even if elements are already formed on the wafer surface. Therefore, in a wafer process during which no flatness control has been possible to execute, a warp of a wafer can be corrected. Furthermore, the wafer surface will not deteriorate because only jet-spraying of gas is applied on the surface.

It is preferred that the gas contains particles made of the same material of that of the gas.

It is also preferred that the method further includes a step of jet-spraying an extremely low temperature gas for cleaning onto a surface opposite to the warped concave surface of the wafer, simultaneously with the step of jet-spraying a gas onto the warped concave surface.

It is preferred that the gas is a gas selected from $CO_2$, He, Ar and $N_2$ gases at an extremely low temperature.

Further objects and advantages of the present invention will be apparent from the following description of the preferred embodiments of the invention as illustrated in the accompanying drawings.

DESCRIPTION OF THE PREFERRED EMBODIMENTS

Figure 1A:
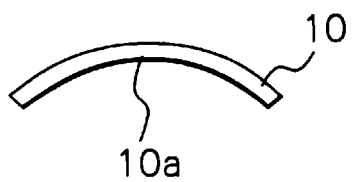
FIGS. 1a–1c schematically illustrate processes in a flatness controlling method as a preferred embodiment according to the present invention.
Figure 1B:
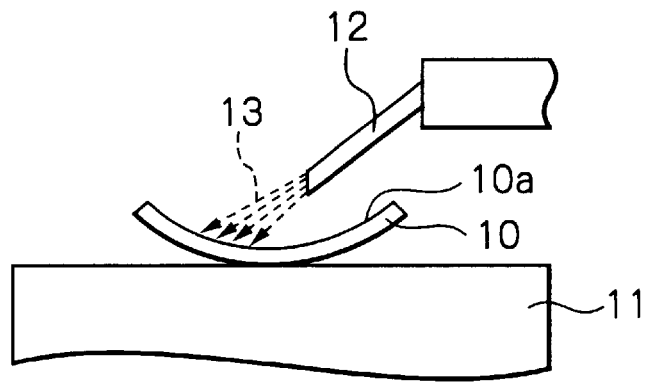
Figure 1C:
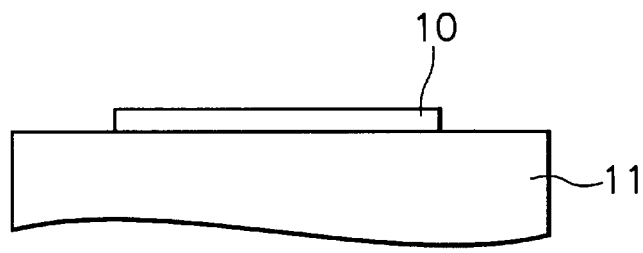

FIGS. 1a–1c schematically illustrate processes in a flatness controlling method as a preferred embodiment according to the present invention.

Suppose that, during a wafer process for fabricating thin-film magnetic heads, a wafer 10 is warped for any reason and thus its back surface 10a is distorted to a concave as shown in FIG. 1a.

According to the flatness controlling method, first, the warped wafer 10 is disposed on a table 11 so that its back surface 10a upwardly directs, and then solid particles of carbon dioxide ($CO_2$), gas of $CO_2$, or a combination of the solid particles and gas of $CO_2$ 13 at an extremely low temperature are jet-sprayed from a nozzle 12 onto the whole back surface 10a of the wafer 10, as shown in FIG. 1b. In case of the single nozzle 12, this nozzle 12 and the table 11 will be relatively scanned to spray over the whole area of the wafer back surface 10a. If there are a plurality of nozzles, the whole back surface 10a will be splayed at a time without scanning.

A stress will be produced on the wafer back surface 10a by a thermal shock effect due to the temperature difference between the front and back surfaces of the wafer 10 and by a blast effect of the sprayed particles to bring the stresses on the front and back surfaces of the wafer 10 into balance. As a result, the warp will be corrected to improve the flatness of the wafer surface as shown in FIG. 1c.

The jet-spray process in this embodiment, shown in FIG. 1b, may be performed by a precision cleaning system of Eco-Snow System Inc., using an extremely low temperature gaseous and solid $CO_2$ jet-spray. In the case, the opposite surface or front surface of the wafer will be heated to keep a temperature of about 60° C.

This Eco-Snow™ precision cleaning system is used for cleaning a semiconductor wafer by removing unnecessary material such as photoresist material and redeposited material, or contaminations, produced on the wafer during a manufacturing process of semiconductor integrated circuits. According to this system, a gaseous and solid $CO_2$ jet-spray directed onto the wafer cools or freezes the photoresist or redeposited material and causes a mismatch in the thermal coefficient of expansion of the material and the wafer. The photoresist or redeposited material debonds from the wafer due to the induced thermal shock to the material. This rapid shrinkage loosens the material and allows the solid particles in the jet-spray to knock the material. The jet-spray, then, removes the material from the surface of the wafer.

Table 1 shows the actually measured result of change in the warp of a wafer using this Eco-Snow™ precision cleaning system. In the table, each numeral denotes a degree of the warp of the wafer, more concretely a height of the convex top from the reference level of the warped wafer (the level of the outer regions of the warped wafer). This height is positive when the convex directs to the element integration or front surface of the wafer and uses $\mu m$ as a unit. In the table, also, "After two scanning of front (back) surface" means that after both ways scanning of the jet-spray from the nozzle of the Eco-Snow™ precision cleaning system, namely after first scanning over the front (back) surface of the wafer and second scanning over the front (back) surface of the 180° turned wafer. The measurement of the warp was carried out by using Surfcom manufactured by Tokyo Seimitsu Co., Ltd. The measured length was 68 mm and the samples were left indoors for 10 minutes or more before measurement.

TABLE 1

(unit: $\mu m$)

|  | Sample 1 | Sample 2 | Sample 3 | Average |
|---|---|---|---|---|
| Initial State (a) | 0.72 | 0.64 | 0.60 | 0.65 |
| After Two Scanning of Front Surface (b) | 1.24 | 1.20 | 1.12 | 1.19 |
| After Two Scanning of Back Surface (c) | 0.64 | 1.00 | 0.68 | 0.77 |
| After Three Days From (c), (d) | 0.72 | 1.08 | 0.64 | 0.81 |
| Changed Amount (b)-(a) | 0.52 | 0.56 | 0.52 | 0.53 |
| Changed Amount (c)-(b) | −0.60 | −0.20 | −0.44 | −0.41 |
| Changed Amount (c)-(a) | −0.08 | 0.36 | 0.08 | 0.12 |
| Changed Amount (d)-(c) | 0.08 | 0.08 | −0.04 | 0.04 |

As will be apparent from this measured result, if a front or element integration surface of a wafer in an initial state with substantially no warp is processed by the Eco-Snow™ precision cleaning system to remove unnecessary material or contaminations, a stress may be produced to warp the wafer so that a convex directs to the wafer front surface. Then, if an extremely low temperature gaseous and solid $CO_2$ is jet-sprayed onto a back surface of the warped wafer by means of the Eco-Snow™ precision cleaning system, the warp is corrected and the wafer is returned to the substantially initial state. Since the corrected state is kept as it is even after three days, it can be understood that the warp of the wafer is not temporally corrected due to the temperature difference between the front and back surfaces of the wafer.

According to this embodiment, as aforementioned, a warp or distortion of a wafer can be easily corrected by jet-spraying an extremely low temperature gaseous and solid $CO_2$. Thus, a flatness of the wafer can be easily controlled within a desired range in a short time during the wafer process. In complicated wafer processes, if this warp correction is repeatedly performed, it is possible to precisely complete each process. As a result, high performance thin-film magnetic heads can be fabricated with an excellent yield. Also, according to this embodiment, since the warp of the wafer can be corrected by jet-spraying a gas without contacting to the wafer surface, the flatness control can of a wafer surface be carried out even if elements are already formed on the wafer surface. This means that, in a wafer process during which no flatness control has been possible to execute, a warp of a wafer can be corrected. Furthermore, according to this embodiment, the wafer surface will not deteriorate because only jet-spraying of gas is applied on the surface.

Instead of using $CO_2$ gas, an extremely low temperature gas and solid particles of He, Ar or $N_2$ may be used.

Figure 2:
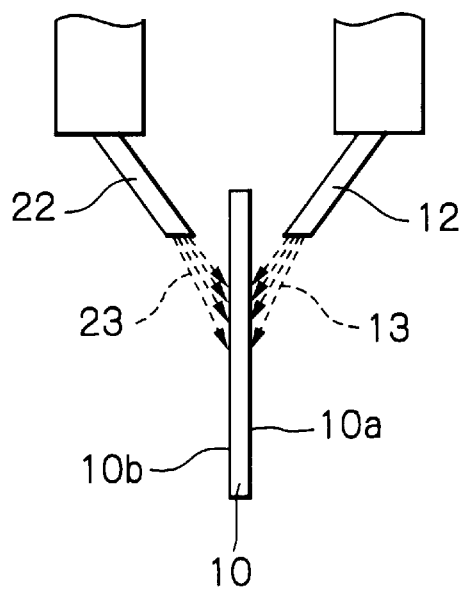
FIG. 2 schematically illustrates a process in a flatness controlling method as another embodiment according to the present invention.

FIG. 2 schematically illustrates a process in a flatness controlling method as another embodiment according to the present invention.

In this embodiment, a front surface 10b of a wafer 10 is cleaned by removing unnecessary material such as photoresist material and redeposited material, or contaminations using the Eco-Snow™ precision cleaning system, and simultaneously a back surface 10a of the wafer 10 is jet-sprayed by an extremely low temperature gas and solid particle of $CO_2$ so to correct a warp of the wafer induced by the cleaning of the front surface and by another wafer process concurrently with the cleaning.

Namely, as shown in FIG. 2, solid particles and gas of $CO_2$ 23 at an extremely low temperature are jet-sprayed from a nozzle 22 onto the whole element integration surface 10b of the wafer 10 to clean the surface 10b, and at the same time, extremely low temperature solid particles and gas of $CO_2$ are jet-sprayed from the nozzle 12 onto the whole back surface 10a of the wafer 10. If each of the nozzles 12 and 22 is a single nozzle, these nozzles 12 and 22 and the wafer 10 will be relatively scanned to spray over the whole area of the wafer surfaces.

Thus, the stresses on the front and back surfaces of the wafer 10 are brought into balance resulting that no warp is produced or that already induced warp is corrected to improve the flatness of the wafer surface.

Other advantages and modifications of this embodiment are substantially the same as these of the embodiment of FIGS. 1a–1c.

Many widely different embodiments of the present invention may be constructed without departing from the spirit and scope of the present invention. It should be understood that the present invention is not limited to the specific embodiments described in the specification, except as defined in the appended claims.

What is claimed is:

1. A method for controlling a flatness of a wafer with a warped concave surface, comprising the steps of:
    disposing said wafer on a table; and
    jet-spraying a gas at an extremely low temperature onto said surface of said wafer on the table to correct the warped concave surface flat.

2. The method as claimed in claim 1, wherein said gas contains particles made of the same material of that of the gas.

3. The method as claimed in claim 1, wherein said method further comprises a step of jet-spraying an extremely low temperature gas for cleaning onto a surface opposite to said warped concave surface of said wafer, simultaneously with said step of jet-spraying a gas onto said warped concave surface.

4. The method as claimed in claim 1, wherein said gas is a $CO_2$ gas at an extremely low temperature.

5. The method as claimed in claim 1, wherein said gas is a gas selected from He, Ar and $N_2$ gases at an extremely low temperature.

6. A manufacturing method of a thin-film magnetic head comprising the steps of:

forming on a surface of a wafer a plurality of thin-film magnetic transducer elements;

when one surface of said wafer warps as a warped concave surface, jet-spraying a gas at an extremely low temperature onto said warped concave surface of said wafer to correct the warped concave surface flat; and separating said wafer into individual thin-film magnetic heads.

7. The manufacturing method as claimed in claim 6, wherein said gas contains particles made of the same material of that of the gas.

8. The manufacturing method as claimed in claim 6, wherein said method further comprises a step of jet-spraying an extremely low temperature gas for cleaning onto a surface opposite to said warped concave surface of said wafer, simultaneously with said step of jet-spraying a gas onto said warped concave surface.

9. The manufacturing method as claimed in claim 6, wherein said gas is a $CO_2$ gas at an extremely low temperature.

10. The manufacturing method as claimed in claim 6, wherein said gas is a gas selected from He, Ar and $N_2$ gases at an extremely low temperature.

* * * * *